(12) United States Patent
Maki et al.

(10) Patent No.: US 12,308,294 B2
(45) Date of Patent: May 20, 2025

(54) BONDING APPARATUS AND BONDING METHOD

(71) Applicant: Tokyo Electron Limited, Tokyo (JP)

(72) Inventors: Tetsuya Maki, Koshi (JP); Tatsumi Oonishi, Koshi (JP); Toshifumi Inamasu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 417 days.

(21) Appl. No.: 17/664,486

(22) Filed: May 23, 2022

(65) Prior Publication Data

US 2022/0375799 A1 Nov. 24, 2022

(30) Foreign Application Priority Data

May 24, 2021 (JP) ................... 2021-087109

(51) Int. Cl.
*H01L 21/66* (2006.01)
*H01L 23/00* (2006.01)

(52) U.S. Cl.
CPC .............. *H01L 22/12* (2013.01); *H01L 24/75* (2013.01); *H01L 24/83* (2013.01); *H01L 2224/751* (2013.01); *H01L 2224/75753* (2013.01); *H01L 2224/83093* (2013.01); *H01L 2224/8313* (2013.01); *H01L 2224/83894* (2013.01)

(58) Field of Classification Search
None
See application file for complete search history.

(56) References Cited

U.S. PATENT DOCUMENTS

| | | |
|---|---|---|
| 2015/0231873 A1 | 8/2015 | Okamoto et al. |
| 2019/0273063 A1 | 9/2019 | Nakamitsu et al. |
| 2023/0275062 A1* | 8/2023 | Inamasu ................. H01L 24/80 438/455 |

FOREIGN PATENT DOCUMENTS

| | | |
|---|---|---|
| JP | H10-092735 A | 4/1998 |
| WO | 2014/064944 A1 | 5/2014 |
| WO | 2018/088094 A1 | 5/2018 |

* cited by examiner

*Primary Examiner* — Hsien Ming Lee
(74) *Attorney, Agent, or Firm* — Chrisman Gallo Tochtrop LLC (57) ABSTRACT

A bonding apparatus includes a first holder, a second holder, a first interferometer, a housing, a gas supply and an airflow control cover. The first holder attracts and holds the first substrate. The second holder attracts and holds the second substrate. The first interferometer measures, by radiating light to the second holder or a first object which is moved along with the second holder in the first horizontal direction, a distance to the second holder or the first object in the first horizontal direction. The housing accommodates therein the first holder, the second holder and the first interferometer. The gas supply is provided at a lateral side of the housing, and supplies a gas into the housing. The airflow control cover is provided within the housing, and redirects a part of a flow of the gas supplied from the gas supply toward a first path of the light.

12 Claims, 9 Drawing Sheets

BONDING APPARATUS AND BONDING METHOD

CROSS-REFERENCE TO RELATED APPLICATION

This application claims the benefit of Japanese Patent Application No. 2021-087109 filed on May 24, 2021, the entire disclosure of which is incorporated herein by reference.

TECHNICAL FIELD

The various aspects and embodiments described herein pertain generally to a bonding apparatus and a bonding method.

BACKGROUND

Conventionally, in order to meet the demand for high integration of semiconductor devices, it has been proposed to use a three-dimensional integration technique of stacking semiconductor devices three-dimensionally. As one of these three-dimensional integration techniques, there is known a bonding technique of bonding substrates such as semiconductor wafers to each other.

Patent Document 1: International Publication No. 2018/088094

SUMMARY

In one exemplary embodiment, a bonding apparatus is configured to bond a first substrate and a second substrate. The bonding apparatus includes a first holder, a second holder, a first moving unit, a first interferometer, a housing, a gas supply and an airflow control cover. The first holder is configured to attract and hold the first substrate. The second holder is configured to attract and hold the second substrate. The first moving unit is configured to move the second holder with respect to the first holder in a first horizontal direction. The first interferometer is configured to measure, by radiating light to the second holder or a first object which is moved along with the second holder in the first horizontal direction, a distance to the second holder or the first object in the first horizontal direction. The housing accommodates therein the first holder, the second holder, the first moving unit and the first interferometer. The gas supply is provided at a lateral side of the housing, and configured to supply a gas into the housing. The airflow control cover is provided within the housing, and configured to redirect a part of a flow of the gas supplied from the gas supply toward a first path of the light radiated from the first interferometer.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the various drawings, same or corresponding parts will be assigned same reference numerals, and redundant description may be omitted. Further, the X-axis direction, the Y-axis direction and the Z-axis direction are orthogonal to each other. The X-axis and Y-axis directions are horizontal directions, and the Z-axis direction is a vertical direction.

First, referring to FIG. 1 and FIG. 2, a bonding system 1 according to an exemplary embodiment will be described. The bonding system 1 is configured to bond a first substrate W1 and a second substrate W2 shown in FIG. 3 to fabricate a combined substrate T. At least one of the first substrate W1 and the second substrate W2 is a substrate prepared by forming a plurality of electronic circuits on a semiconductor substrate such as, but not limited to, a silicon wafer or a compound semiconductor wafer. One of the first substrate W1 and the second substrate W2 may be a bare wafer having no electronic circuit formed thereon. The first substrate W1 and the second substrate W2 have approximately the same diameter. Although the compound semiconductor wafer is not particularly limited, it may be, by way of non-limiting example, a GaAs wafer, a SiC wafer, a GaN wafer, or an InP wafer. In addition, a glass substrate may be used instead of the semiconductor substrate.

Figure 3:
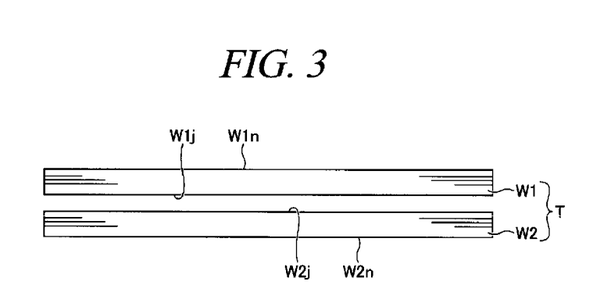
FIG. 3 is a side view illustrating an example of a first substrate and a second substrate.

Hereinafter, the first substrate W1 will sometimes be referred to as "upper wafer W1", the second substrate W2 will sometimes be referred to as "lower wafer W2", and the combined substrate T will sometimes be referred to as "combined wafer T". As depicted in FIG. 3, among surfaces of the upper wafer W1, the surface to be bonded to the lower wafer W2 will be referred to as "bonding surface W1j", and the surface opposite to the bonding surface W1j will be referred to as "non-bonding surface W1n". Further, among surfaces of the second substrate W2, the surface to be bonded to the first substrate W1 will be referred to as "bonding surface W2j", and the surface opposite to the bonding surface W2j will be referred to as "non-bonding surface W2n."

Figure 1:
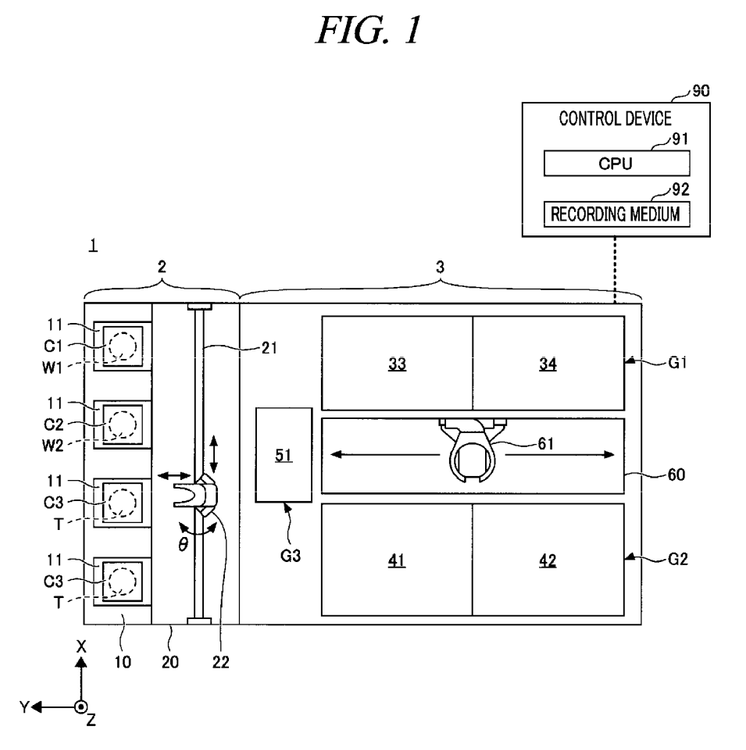
FIG. 1 is a plan view illustrating a bonding system according to an exemplary embodiment.

As illustrated in FIG. 1, the bonding system 1 includes a carry-in/out station 2 and a processing station 3. The carry-in/out station 2 and the processing station 3 are arranged in the order of the carry-in/out station 2 and the processing station 3 along the negative Y-axis direction. Further, the carry-in/out station 2 and the processing station 3 are connected as one body.

The carry-in/out station 2 includes a placing table 10 and a transfer section 20. The placing table 10 is equipped with a multiple number of placing plates 11. Respectively provided on the placing plates 11 are cassettes C1 to C3 each of which accommodates therein a plurality of (e.g., 25 sheets of) substrates horizontally. The cassette C1 accommodates therein first substrates W1; the cassette C2, second substrates W2; and the cassette C3, combined substrates T. Further, in the cassettes C1 and C2, the upper wafers W1 and the lower wafers W2 are accommodated with their bonding surfaces W1j and W2j facing upwards in the same direction.

The transfer section 20 is provided adjacent to the negative Y-axis side of the placing table 10. Provided in the transfer section 20 are a transfer path 21 extending in the X-axis direction and a transfer device 22 configured to be movable along the transfer path 21. The transfer device 22 is also configured to be movable in the Y-axis direction and pivotable around the Z-axis, and serves to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing table 10 is not limited to the shown example. Moreover, a cassette for collecting a defective substrate, or the like may also be disposed on the placing table 10 in addition to the cassettes C1, C2, and C3.

The processing station 3 is equipped with, for example, three processing blocks G1, G2 and G3. For example, the first processing block G1 is disposed on the rear side (positive X-axis side of FIG. 1) of the processing station 3, and the second processing block G2 is provided on the front side (negative X-axis side of FIG. 1) of the processing station 3. Further, the third processing block G3 is disposed on the carry-in/out station 2 side (positive Y-axis side of FIG. 1) of the processing station 3.

A transfer section 60 is formed in a region surrounded by the first processing block G1 to the third processing block G3. A transfer device 61 is disposed in the transfer section 60. The transfer device 61 is equipped with, for example, a transfer arm which is configured to be movable in the vertical direction and the horizontal directions and pivotable around a vertical axis.

The transfer device 61 is moved within the transfer section 60 and transfers the upper wafers W1, the lower wafers W2, and the combined wafers T to preset apparatuses within the first processing block G1, the second processing block G2, and the third processing block G3 which are adjacent to the transfer section 60.

Provided in the first processing block G1 are, for example, a surface modifying apparatus 33 and a surface hydrophilizing apparatus 34. The surface modifying apparatus 33 is configured to modify the bonding surface W1j of the upper substrate W1 and the bonding surface W2j of the lower wafer W2. The surface hydrophilizing apparatus 34 is configured to hydrophilize the modified bonding surface W1j of the upper wafer W1 and the modified bonding surface W2j of the lower wafer W2.

By way of example, the surface modifying apparatus 34 cuts $SiO_2$ bonds in the bonding surfaces W1j and W2j, and forms dangling bonds of Si, thus enabling the bonding surfaces W1j and W2j to be hydrophilized afterwards. In the surface modifying apparatus 33, in a decompressed atmosphere, for example, an oxygen gas, which is a processing gas, is excited into plasma to be ionized. Then, as oxygen ions are radiated to the bonding surface W1j of the upper wafer W1 and the bonding surface W2j of the lower wafer W2, the bonding surfaces W1j and W2j are plasma-processed to be modified. The processing gas is not limited to the oxygen gas, but may be, by way of non-limiting example, a nitrogen gas.

The surface hydrophilizing apparatus 34 is configured to hydrophilize the bonding surfaces W1j of the upper wafer W1 and the bonding surface W2j of the lower wafer W2 with a hydrophilizing liquid such as, but not limited to, pure water. Further, the surface hydrophilizing apparatus 34 also has a function of cleaning the bonding surfaces W1j and W2j. In the surface hydrophilizing apparatus 34, while rotating the upper wafer W1 or the lower wafer W2 held by, for example, a spin chuck, the pure water is supplied onto the upper wafer W1 or the lower wafer W2. Accordingly, the pure water diffuses on the bonding surfaces W1j and W2j, and OH groups combine with the dangling bonds of Si, so that the bonding surfaces W1j and W2j are hydrophilized.

The second processing block G2 is equipped with, for example, a bonding apparatus 41, a first temperature control device 42, and a second temperature control device 43. The bonding apparatus 41 is configured to bond the hydrophilized upper and lower wafers W1 and W2 to produce the combined wafer T. The first temperature control device 42 is configured to adjust a temperature distribution of the upper wafer W1 before it is bonded, that is, before it is brought into contact with the lower wafer W2. The second temperature control device 43 is configured to adjust a temperature distribution of the lower wafer W2 before it is bonded, that is, before it is brought into contact with the upper wafer W1. Further, in the present exemplary embodiment, although the first temperature control device 42 and the second temperature control device 43 are provided separately from the bonding apparatus 41, they may be configured as a part of the bonding apparatus 41.

Figure 2:
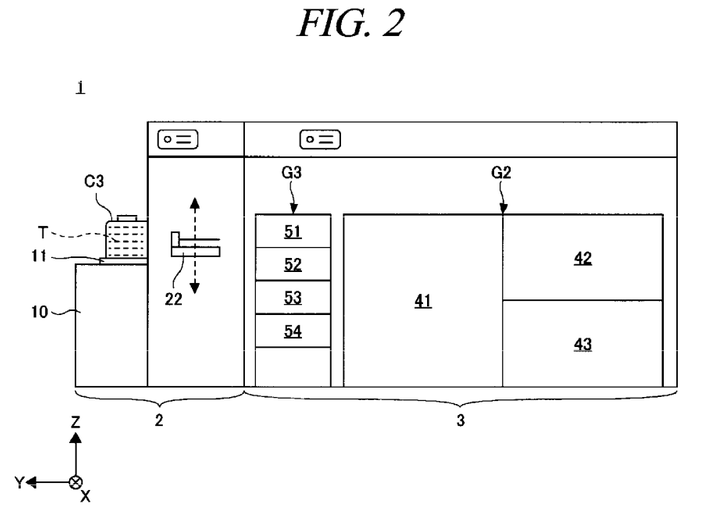
FIG. 2 is a side view of the bonding system of FIG. 1.

The third processing block G3 is equipped with, for example, a first position adjusting device 51, a second position adjusting device 52, and transition devices 53 and 54 stacked in this order from the top toward the bottom (see FIG. 2). The locations of the respective devices in the third processing block G3 are not limited to those shown in FIG.

2. The first position adjusting device 51 is configured to adjust a horizontal direction of the upper wafer W1 by rotating the upper wafer W1 around a vertical axis, and configured to invert the upper wafer W1 upside down, thus allowing the bonding surface W1j to face downwards. The second position adjusting device 52 is configured to adjust a horizontal direction of the lower wafer W2 by rotating the lower wafer W2 around a vertical axis. In the transition device 53, the upper wafer W1 is temporarily disposed. Further, in the transition device 54, the lower wafer W2 and the combined wafer T are temporarily disposed. In addition, in the present exemplary embodiment, although the first position adjusting device 51 and the second position adjusting device 52 are provided separately from the bonding apparatus 41, they may be configured as a part of the bonding apparatus 41.

The bonding system 1 is equipped with a control device 90. The control device 90 is, for example, a computer, and includes a CPU (Central Processing Unit) 91 and a recording medium 92 such as a memory. The recording medium 92 stores therein a program for controlling various processings performed in the bonding system 1. The control device 90 causes the CPU 91 to execute the program stored in the recording medium 92 to control the operation of the bonding system 1.

Figure 4:
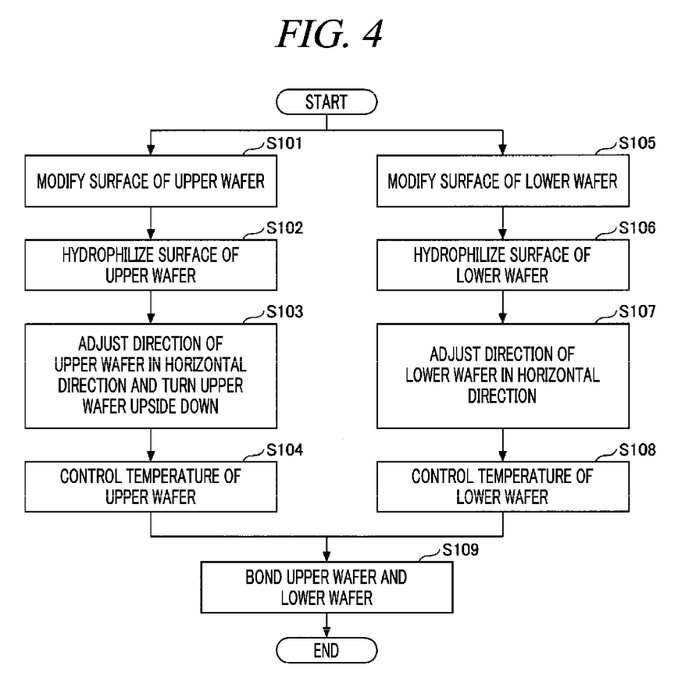
FIG. 4 is a flowchart illustrating a bonding method according to the exemplary embodiment.

Now, referring to FIG. 4, a bonding method according to the present exemplary embodiment will be explained. The bonding method includes, for example, processes S101 to S109. The processes S101 to S109 are performed under the control of the control device 90. Further, the bonding method may not include all of the processes S101 to S109. For example, the bonding method may not include the processes S104 and S108. Furthermore, the bonding method may include a processing besides the processes S101 to S109.

First, the cassette C1 accommodating therein a plurality of upper wafers W1, the cassette C2 accommodating therein a plurality of lower wafers W2, and the empty cassette C3 are disposed on the placing table 10 in the carry-in/out station 2.

Then, the transfer device 22 takes out the upper wafer W1 from the cassette C1 and transfers it to the transition device 53 of the third processing block G3 of the processing station 3. Thereafter, the transfer device 61 takes out the upper wafer W1 from the transition device 53, and transfers it to the surface modifying apparatus 33 of the first processing block G1.

Next, the surface modifying apparatus 33 modifies the bonding surface W1j of the upper wafer W1 (process S101). The modification of the bonding surface W1j is performed with the bonding surface W1j facing upwards. Thereafter, the transfer device 61 takes out the upper wafer W1 from the surface modifying apparatus 33, and transfers it to the surface hydrophilizing apparatus 34.

Subsequently, the surface hydrophilizing apparatus 34 hydrophilizes the bonding surface W1j of the upper wafer W1 (process S102). The hydrophilization of the bonding surface W1j is performed with the bonding surface W1j facing upwards. Thereafter, the transfer device 61 takes out the upper wafer W1 from the surface hydrophilizing apparatus 34, and transfers it to the first position adjusting device 51 of the third processing block G3.

Then, the first position adjusting device 51 adjusts the horizontal direction of the upper wafer W1 by rotating the upper wafer W1 around the vertical axis, and turns the upper wafer W1 upside down (process 103). As a result, a notch of the upper wafer W1 is directed toward a predetermined direction, and the bonding surface W1j of the upper wafer W1 is turned to face downwards. Thereafter, the transfer device 61 takes out the upper wafer W1 from the first position adjusting device 51, and transfers it to the first temperature adjusting device 42 of the second processing block G2.

Afterwards, the first temperature control device 42 adjusts the temperature of the upper wafer W1 (process S104). The temperature control over the upper wafer W1 is performed in the state that the bonding surface W1j of the upper wafer W1 faces downwards. Thereafter, the transfer device 61 takes out the upper wafer W1 from the first temperature control device 42, and transfers it to the bonding apparatus 41.

In parallel with the above-described processing for the upper wafer W1, a processing for the lower wafer W2 as follows is performed. First, the transfer device 22 takes out the lower wafer W2 from the cassette C2, and transfers it to the transition device 54 of the third processing block G3 of the processing station 3. Then, the transfer device 61 takes out the lower wafer W2 from the transition device 54, and transfers it to the surface modifying apparatus 33 of the first processing block G1.

Subsequently, the surface modifying apparatus 33 modifies the bonding surface W2j of the lower wafer W2 (process S105). The modification of the bonding surface W2j is performed with the bonding surface W2j facing upwards. Then, the transfer device 61 takes out the lower wafer W2 from the surface modifying apparatus 33, and transfers it to the surface hydrophilizing apparatus 34.

Next, the surface hydrophilizing apparatus 34 hydrophilizes the bonding surface W2j of the lower wafer W2 (process S106). The hydrophilization of the bonding surface W2j is performed with the bonding surface W2j facing upwards. Then, the transfer device 61 takes out the lower wafer W2 from the surface hydrophilizing apparatus 34, and transfers it to the second position adjusting device 52 of the third processing block G3.

Thereafter, the second position adjusting device 52 adjusts the horizontal direction of the lower wafer W2 by rotating the lower wafer W2 around the vertical axis (process S107). As a result, a notch of the lower wafer W2 is directed toward a preset direction. Thereafter, the transfer device 61 takes out the lower wafer W2 from the second position adjusting device 52, and transfers it to the second temperature adjusting device 43 of the second processing block G2.

Next, the second temperature control device 43 adjusts the temperature of the lower wafer W2 (process S108). The temperature control over the lower wafer W2 is performed in the state that the bonding surface W2j of the lower wafer W2 faces upwards. Thereafter, the transfer device 61 takes out the lower wafer W2 from the second temperature control device 43, and transfers it to the bonding apparatus 41.

Then, the bonding apparatus 41 bonds the upper wafer W1 and the lower wafer W2 to produce the combined wafer T (process S109). Afterwards, the transfer device 61 takes out the combined wafer T from the bonding apparatus 41, and transfers it to the transition device 54 of the third processing block G3.

Finally, the transfer device 22 takes out the combined wafer T from the transition device 54, and transfers it to the cassette C3 on the placing table 10. Thus, the series of processes are ended.

Now, an example of the bonding apparatus 41 will be discussed with reference to FIG. 5 and FIG. 6. The bonding apparatus 41 includes, for example, a housing 100, an upper chuck 110, a lower chuck 120, a moving unit 130, a gas supply 140, and an exhaust unit 150, a first interferometer 161, a second interferometer 162, and an airflow control cover 170.

The housing 100 is, for example, a box body having a rectangular shape in a plan view. A carry-in/out opening (not shown) is formed at a lateral side of the housing 100 on the transfer section 60 side, and an opening/closing shutter is provided at the carry-in/out opening. The upper wafer W1, the lower wafer W2, and the combined wafer T are carried in and out through the carry-in/out opening.

The housing 100 accommodates therein, for example, a support frame 101, the upper chuck 110, the lower chuck 120, the moving unit 130, the gas supply 140, the exhaust unit 150, the first interferometer 161, the second interferometer 162, and the airflow control cover 170.

The support frame 101 supports, for example, the upper chuck 110, the lower chuck 120, the moving unit 130, the first interferometer 161, the second interferometer 162, and the airflow control cover 170. The support frame 101 includes a placing table 102, a plurality of supporting columns 103 uprightly standing on a top surface of the placing table 102, and an upper frame 104 fixed to upper ends of the plurality of supporting columns 103.

The upper frame 104 supports the upper chuck 110 from above. The upper chuck 110 is configured to attract and hold a top surface (non-bonding surface W1n) of the upper wafer W1 from above. Meanwhile, the lower chuck 120 is provided below the upper chuck 110, and configured to attract and hold a bottom surface (non-bonding surface W2n) of the lower wafer W2 from below.

The moving unit 130 is configured to move the lower chuck 120 in the horizontal directions. By way of example, the moving unit 130 includes a first moving unit 131 configure to move the lower chuck 120 in the X-axis direction. Further, the moving unit 130 includes a second moving unit 132 configured to move the lower chuck 120 in the Y-axis direction.

The first moving unit 131 is configured to be moved along a pair of first rails 131a extending in the X-axis direction. The pair of first rails 131a are provided on a top surface of the second moving unit 132. The moving unit 130 moves the lower chuck 120 in the X-axis direction by moving the first moving unit 131 in the X-axis direction.

The second moving unit 132 is configured to be moved along a pair of second rails 132a extending in the Y-axis direction. The pair of second rails 132a are provided on the top surface of the placing table 102. The moving unit 130 moves the first moving unit 131 and the lower chuck 120 in the Y-axis direction by moving the second moving unit 132 in the Y-axis direction.

The lower chuck 120 is placed on the first moving unit 131, and is moved in the X-axis direction and the Y-axis direction along with the first moving unit 131. Further, the first moving unit 131 may be configured to move the lower chuck 120 in the vertical direction. Furthermore, the first moving unit 131 may be configured to rotate the lower chuck 120 around a vertical axis. A rotational direction about the vertical axis will sometimes be referred to as a θ direction.

The moving unit 130 is configured to perform positional alignment between the upper wafer W1 held by the upper chuck 110 and the lower wafer W2 held by the lower chuck 120 in the horizontal directions by moving the lower chuck 120 in the X-axis direction, the Y-axis direction and the θ direction. In addition, the moving unit 130 is configured to perform positional alignment between the upper wafer W1 held by the upper chuck 110 and the lower wafer W1 held by the lower chuck 120 in the vertical direction by moving the lower chuck 120 in the Z-axis direction.

In addition, the moving unit 130 may be configured to relatively move the upper chuck 110 and the lower chuck 120 in the X-axis direction, the Y-axis direction, and the θ direction. For example, the moving unit 130 may move the upper chuck 110 in the X-axis direction, the Y-axis direction, and the θ direction. Alternatively, the moving unit 130 may move the lower chuck 120 in the X-axis direction and the Y-axis direction while moving the upper chuck 110 in the θ direction.

Between the upper chuck 110 and the lower chuck 120, the one configured to be moved in the X-axis direction by the moving unit 130 (the lower chuck 120 in the present exemplary embodiment) corresponds to a second holder described in the claims, and the other (the upper chuck 110 in the present exemplary embodiment) corresponds to a first holder described in the claims. Further, the X-axis direction corresponds to a first horizontal direction described in the claims, and the Y-axis direction corresponds to a second horizontal direction described in the claims.

The moving unit 130 moves the relative positions of the upper chuck 110 and the lower chuck 120 between a substrate transfer position and a bonding position. The substrate transfer position is a position where the upper chuck 110 receives the upper wafer W1 from the transfer device 61, the lower chuck 120 receives the lower wafer W2 from the transfer device 61, and the lower chuck 120 hands the combined wafer T over to the transfer device 61. The substrate transfer position is a position where the carrying-out of the combined wafer T produced by the $n^{th}$ (n is a natural number equal to or larger than 1) bonding and the carrying-in of the upper wafer W1 and the lower wafer W2 to be bonded through the $(n+1)^{th}$ bonding are performed successively. The substrate transfer position is, for example, a position shown in FIG. 5 and FIG. 6.

The transfer device 61 reaches a position directly under the upper chuck 110 when it transfers the upper wafer W1 to the upper chuck 110. Further, the transfer device 61 reaches a position directly above the lower chuck 120 when it receives the combined wafer T from the lower chuck 120 and transfers the lower wafer W2 to the lower chuck 120. The upper chuck 110 and the lower chuck 120 are set aside and a distance between the upper chuck 110 and the lower chuck 120 in the vertical direction is set to be large such that the transfer device 61 can easily reach those positions.

Meanwhile, the bonding position is a position where the upper wafer W1 and the lower wafer W2 are made to face each other at a predetermined interval therebetween to be bonded to each other. The bonding position is, for example, a position shown in FIG. 7. At the bonding position, a distance G between the upper wafer W1 and the lower wafer W2 in the vertical direction is narrow, as compared to that at the substrate transfer position. Further, unlike at the substrate transfer position, the upper wafer W1 and the lower wafer W2 are overlapped at the bonding position, when viewed from the vertical direction.

The gas supply 140 is configured to supply a gas into the housing 100. The gas is, by way of non-limiting example, dry air, or an inert gas such as a nitrogen gas or an argon gas. The gas supply 140 is, for example, a FFU (Fan Filter Unit), and it supplies a purified gas.

The gas supply 140 supplies the gas regulated to a set temperature. The set temperature is, for example, a room temperature of 23° C. The gas supply 140 is connected to a gas source 143 via a temperature sensor 149, a temperature controller 141, and a valve 142. The temperature sensor 149 is configured to measure a temperature of the gas and output the measured data to the control device 90. The control device 90 controls the temperature controller 141 such that the measured temperature from the temperature sensor 149 becomes the set temperature.

The gas supply 140 may supply the gas regulated to a set humidity.

The gas supply 140 is provided at a side surface 100a orthogonal to the Y-axis direction among a plurality of side surfaces of the housing 100, and discharges the gas in the Y-axis direction (specifically, the positive Y-axis direction).

The exhaust unit 150 is provided at, among the plurality of side surfaces of the housing 100, a side surface 100b opposite to the side surface 100a where the gas supply 140 is provided. The exhaust unit 150 is connected to a suction device (not shown) such as a vacuum pump, and evacuates the housing 100 by using a suction force of this suction device.

The gas supply 140 and the exhaust unit 150 form a side flow within the housing 100.

The first interferometer 161 is configured to measure a distance from a reference point of the first interferometer 161 to a first object 163 in the X-axis direction by radiating light to the first object 163 which moves in the X-axis direction along with the lower chuck 120 serving as the second holder. The first object 163 is mounted to, for example, the first moving unit 131.

The first interferometer 161 is provided on a level with the first object 163. The first object 163 is, for example, a mirror, and has a light reflection surface orthogonal to the X-axis direction. The first interferometer 161 measures the distance from the reference point of the first interferometer 161 to the first object 163 in the X-axis direction by receiving the light reflected from the first object 163.

In addition, the first interferometer 161 may measure a distance to the lower chuck 120 in the X-axis direction by radiating light to the lower chuck 120 serving as the second holder.

The first interferometer 161 outputs the measured data to the control device 90. The control device 90 controls the moving unit 130 by using the data measured by the first interferometer 161, and controls the position of the lower chuck 120 in the X-axis direction. The position control includes a speed control. Further, when controlling the position of the lower chuck 120 in the X-axis direction, the control device 90 may also use a non-illustrated linear scale.

The first interferometer 161 is disposed between the first moving unit 131 and a side surface 100c, among the side surfaces of the housing 100, orthogonal to the X-axis direction. The first interferometer 161 is configured to radiate the light in a direction (the X-axis direction, specifically, the positive X-axis direction) perpendicular to a flow direction (the Y-axis direction, specifically, the positive Y-axis direction) of the side flow. That is, a first path LP1 of the light radiated from the first interferometer 161 is orthogonal to a gas discharge direction (the Y-axis direction, specifically, the positive Y-axis direction) of the gas supply 140.

The second interferometer 162 is configured to measure a distance from a reference point of the second interferometer 162 to a second object 164 by radiating light to the second object 164 which moves in the Y-axis direction along with the lower chuck 120 serving as the second holder. The second object 164 is mounted to, for example, the first moving unit 131.

The second interferometer 162 is provided on a level with the second object 164. The second object 164 is, for example, a mirror, and has a light reflection surface orthogonal to the Y-axis direction. The second interferometer 162 measures the distance from the reference point of the second interferometer 162 to the second object 164 in the Y-axis direction by receiving the light reflected from the second object 164.

Further, the second interferometer 162 may measure a distance to the lower chuck 120 in the Y-axis direction by radiating light to the lower chuck 120 serving as the second holder.

The second interferometer 162 outputs the measured data to the control device 90. The control device 90 controls the moving unit 130 by using the data measured by the second interferometer 162, and controls the position of the lower chuck 120 in the Y-axis direction. The position control includes a speed control. Further, when controlling the position of the lower chuck 120 in the Y-axis direction, the control device 90 may use a non-illustrated linear.

The second interferometer 162 is disposed between the first moving unit 131 and the side surface 100a, among the side surfaces of the housing 100, orthogonal to the Y-axis direction, and between the gas supply 140 and the first moving unit 131. The second interferometer 162 radiates the light in the same direction as the flow direction (the Y-axis direction, specifically, the positive Y-axis direction) of the side flow. That is, a second path LP2 of the light radiated from the second interferometer 162 is parallel to the gas discharge direction of the gas supply 140.

The first interferometer 161 and the second interferometer 162 are, for example, laser interferometers, and they radiate laser beams. However, the light radiated from the first interferometer 161 and the second interferometer 162 is not limited to the laser beam, but it may be any light with directivity having a regular cycle.

In the first path LP1, if temperature, humidity, atmospheric pressure, or the like fluctuates, a refractive index of air fluctuates, causing an optical path length (the product of a path length and the refractive index) to fluctuate as well. As a result, the measured value of the first interferometer 161 fluctuates, resulting in a measurement error. By way of example, if the fluctuation range of the temperature is 0.1° C. when the length of the first path LP1 is 300 mm, the fluctuation range of the measured value is theoretically about 28 nm. Here, the fluctuation range is a difference between a maximum value and a minimum value.

In order to reduce the measurement error of the first interferometer 161, it is effective to reduce the fluctuations in the temperature, the humidity, and the atmospheric pressure in the first path LP1, and it is also effective to form a stable airflow. Likewise, in order to reduce the measurement error of the second interferometer 162, it is effective to reduce the fluctuations in the temperature, the humidity, and the atmospheric pressure in the second path LP2 and to form a stable airflow.

An electric equipment, such as a motor, an amplifier, a laser light source, or a camera, is provided on a level with the first path LP1 and the second path LP2. The electric equipment may be a heat source that varies the temperature of the gas or an obstacle that disturbs the gas flow. In addition to the electric equipment, the supporting column 103 of the support frame 101 may also become the obstacle. Here, the obstacle include not only a stationary object, but also a movable object. An example of such movable object may be the first moving unit 131. The movable object not only becomes the obstacle when it is stopped, but can also generate a new gas flow when it is moving.

The gas supply 140 discharges the gas in the positive Y-axis direction, and forms the side flow flowing in the positive Y-axis direction. The side flow has a temperature distribution in the X-axis direction due to heat from the electric equipment, heat transferred from the outside of the housing 100, and so forth. In addition, the direction of the side flow may be disturbed by the obstacles. Thus, the side flow always fluctuates both in the temperature and in the direction.

While the second path LP2 is parallel to the side flow, the first path LP1 is orthogonal to the side flow. Since the first path LP1 crosses the side flow, it is easily affected by the fluctuation of the side flow. For this reason, conventionally, the measurement error of the first interferometer 161 has been larger than the measurement error of the second interferometer 162.

In view of this, in the present exemplary embodiment, a part of the flow of the gas supplied from the gas supply 140 is redirected to the first path LP1 by using the airflow control cover 170. Since the gas less affected by the heat source and the obstacles can be redirected toward the first path LP1, an airflow having stable temperature and direction can be formed in the first path LP1. As a result, the fluctuation range of the measured value of the first interferometer 161 can be reduced, so that the measurement error of the first interferometer 161 can be reduced. Therefore, the accuracy of the position control over the lower chuck 120 can be improved, so that the accuracy of the bonding between the lower wafer W2 and the upper wafer W1 can be improved. By using the airflow control cover 170, it is also possible to suppress the fluctuation range of the measured value of the first interferometer 161 to less than 10 nm.

As a technique different from the technique of the present disclosure, it may be considered to surround the first path LP1 with a cylindrical cover, for example. In this case, since this cylindrical cover needs to be moved along with the lower chuck 120, there is a likelihood that the structure of the bonding apparatus 41 may become complicated to allow the cylindrical cover and other components not to interfere with each other. In addition, the movable range of the lower chuck 120 is likely to be limited.

In addition, as another technique different from the technique of the present disclosure, it may also be considered to surround the first path LP1 with a cylindrical spot airflow. In this case, a second gas supply for forming the spot airflow is required in addition to the gas supply 140. Moreover, there is a risk that a temperature difference or a pressure difference between the spot airflow and the side flow may cause a problem.

In addition, as yet another technique different from the technique of the present disclosure, it may be also considered to form a downflow in the entire inside of the housing 100. In this case, however, there may be many obstacles that obstruct the formation of the downflow, so that the airflow may be easily disturbed. Furthermore, it is not practical to provide the exhaust unit 150 at each of four corners of the bottom surface of the housing 100 to stabilize the downflow.

In contrast, according to the exemplary embodiment of the present disclosure, by redirecting a part of the flow of the gas supplied from the gas supply 140 to the first path LP1 through the airflow control cover 170, the airflow with stable temperature and direction is formed. Therefore, as compared to the case of using the cylindrical cover surrounding the first path LP1, the movable range of the lower chuck 120 is difficult to limit, and the structure of the bonding apparatus 41 is simple. Further, unlike the case of forming the cylindrical spot airflow surrounding the first path LP1, the temperature difference or the pressure difference between the spot airflow and the side flow would not become a problem, and the second gas supply is not required. Additionally, as compared to the case where the downflow is formed in the entire inside of the housing 100, there are fewer obstacles, so that the stable airflow is easily formed.

Figure 6:
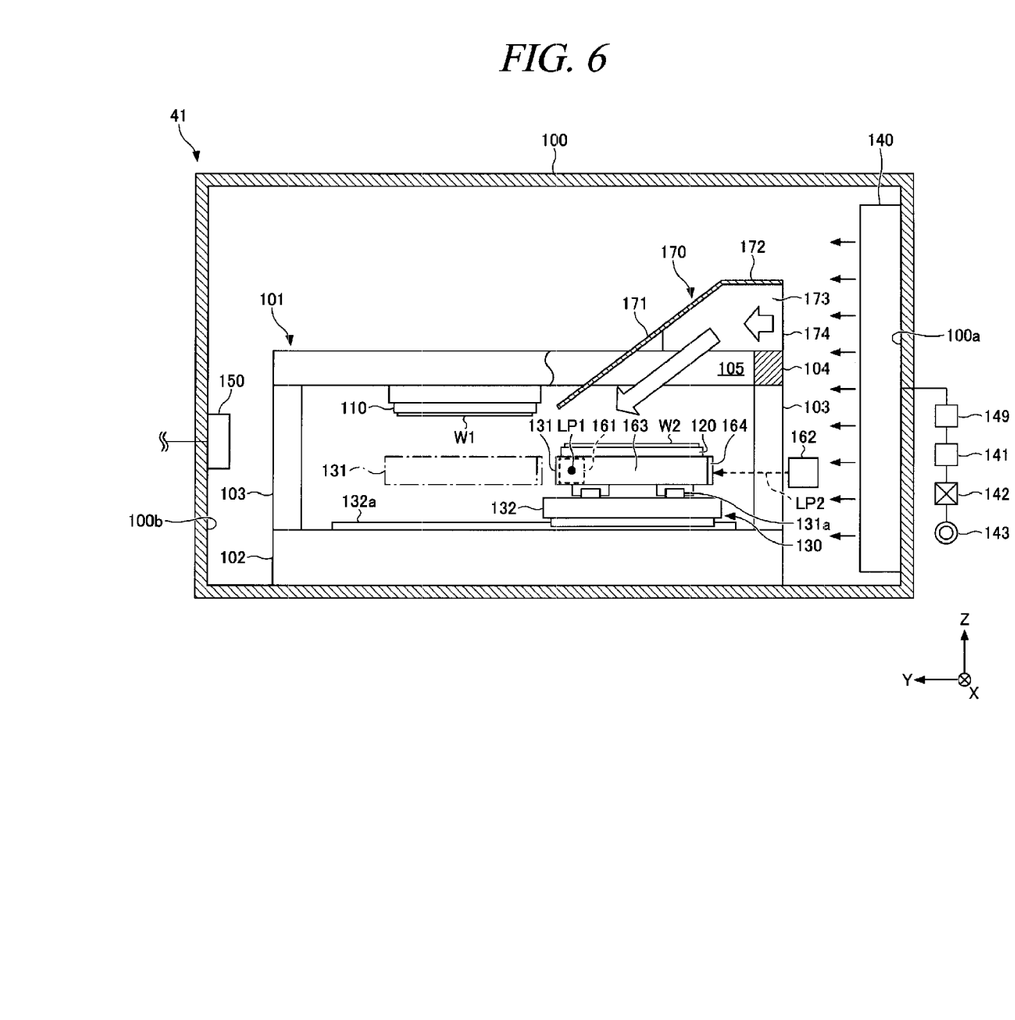
FIG. 6 is a side view of the bonding apparatus of FIG. 5.

As illustrated in FIG. 6, the airflow control cover 170 may redirect a part of the gas flow toward the first path LP1 from obliquely above it. At a height different from that of the first path LP1, there are few heat sources and obstacles (including both stationary and movable objects). Accordingly, it is possible to change the direction of (redirect) the gas which is stable in temperature and direction toward the first path LP1.

For example, the airflow control cover 170 may redirect a part of the gas flow toward the first path LP1 from above the support frame 101. Above the support frame 101, there are especially few heat sources and obstacles. Accordingly, it is possible to change the direction of the gas which is especially stable in temperature and direction toward the first path LP1.

The airflow control cover 170 may include, for example, an inclined plate 171 that is inclined downwards toward the gas discharge direction (positive Y-axis direction) of the gas supply 140. The inclined plate 171 enables to change the direction of the gas flow smoothly. Although the inclined plate 171 is a flat plate in the present exemplary embodiment, it may be a curved plate instead.

An opening 105 through which the inclined plate 171 passes is formed through the upper frame 104 of the support frame 101. The gas whose direction is changed by the inclined plate 171 passes through the opening 105 of the upper frame 104 to be guided to the first path LP1.

An upper end of the inclined plate 171 is disposed above the upper frame 104 and below a ceiling of the housing 100. Meanwhile, a lower end of the inclined plate 171 is disposed below the upper frame 104 and above a bottom surface of the upper chuck 110 which attracts and holds the upper wafer W1.

If the lower end of the inclined plate 171 is disposed above the bottom surface of the upper chuck 110, interference between the upper wafer W1 and the inclined plate 171 can be suppressed when the upper wafer W1 is carried in or out. Further, when the lower chuck 120 is moved, interference between the lower chuck 120 or the lower wafer W2 held by the lower chuck 120 and the inclined plate 171 can also be suppressed.

The airflow control cover 170 may include, besides the inclined plate 171, a horizontal plate 172 and a pair of vertical plates 173. The pair of vertical plates 173 are disposed to be orthogonal to the X-axis direction, and they are arranged at a certain distance therebetween in the X-axis direction. The vertical plate 173 has, for example, a right-angled trapezoid shape.

The horizontal plate 172, the pair of vertical plates 173, and the upper frame 104 form an inlet 174 for the gas. The gas discharged from the gas supply 140 passes through the inlet 174 and then obliquely flows downwards along the inclined plate 171.

Figure 5:
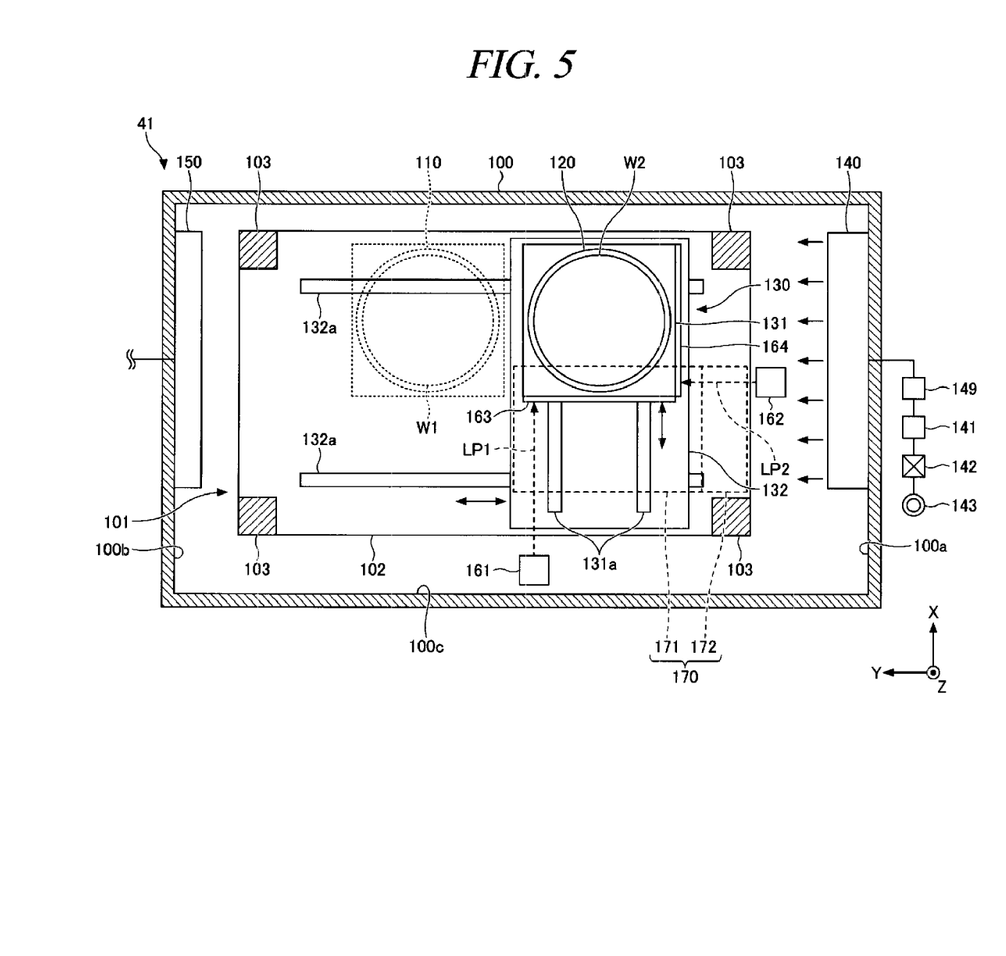
FIG. 5 is a plan view illustrating an example of a bonding apparatus.

As depicted in FIG. 5, a size of the airflow control cover 170 in the X-axis direction may be smaller than a size of the upper frame 104 in the X-axis direction. Thus, a space for an electric wiring or the like can be securely provided on the upper frame 104.

As shown in FIG. 5, when viewed from the top, the airflow control cover 170 may overlap with the second path LP2 of the light radiated from the second interferometer 162.

As indicated by a dashed-dotted line in FIG. 6, when the first moving unit 131 is far from the second interferometer 162 and the length of the second path LP2 is thus long, the gas whose direction is changed by the airflow control cover 170 can also be supplied to the second path LP2. Accordingly, an airflow having stable temperature and direction can be formed in the second path LP2 as well. As a result, the fluctuation range of the measured value of the second interferometer 162 can be reduced, so that the measurement error of the second interferometer 162 can be reduced.

Now, referring to FIG. 7, the upper chuck 110 and the lower chuck 120 will be explained. The upper chuck 110 is divided into a plurality of (for example, three) regions 110a, 110b and 110c. These regions 110a to 110c are arranged in this order from a center of the upper chuck 110 toward a periphery thereof. When viewed from the top, the region 110a has a circular shape, and the regions 110b and 110c have an annular shape.

Suction pipes 111a, 111b and 111c are independently provided in the regions 110a, 110b and 110c, respectively. Vacuum pumps 112a, 112b and 112c are respectively connected to the suction pipes 111a, 111b and 111c. The upper chuck 110 is capable of vacuum-attracting the upper wafer W1 in each of the regions 110a, 110b, and 110c individually.

The upper chuck 110 is provided with a plurality of holding pins 115 configured to be movable up and down in the vertical direction. The plurality of holding pins 115 are connected to a vacuum pump 116, and serve to vacuum-attract the upper wafer W1 by the operation of the vacuum pump 116. The upper wafer W1 is vacuum-attracted to lower ends of the plurality of holding pins 115. Instead of the holding pins 115, a ring-shaped suction pad may be used.

The holding pins 115 are protruded from a holding surface of the upper chuck 110 when they are lowered. In this state, the holding pins 115 vacuum-attract the upper wafer W1 and receive the upper wafer W1 from the transfer device 61. Thereafter, the holding pins 115 are raised, so the upper wafer W1 comes into contact with the holding surface of the upper chuck 110. Next, the upper chuck 110 vacuum-attracts the upper wafer W1 horizontally in each of the regions 110a, 110b and 110c by the operation of the vacuum pumps 112a, 112b and 112c.

Further, a through hole 113 is vertically formed through a central portion of the upper chuck 110. A pressing unit 190, which will be described later, is inserted through the through hole 113. The pressing unit 190 presses the center of the upper wafer W1 disposed apart from the lower wafer W2 at a certain distance, thus allowing the center of the upper wafer W1 to come into contact with the lower wafer W2.

The pressing unit 190 has a pressing pin 191 and an outer cylinder 192 which is configured as an elevation guide of the pressing pin 191. The pressing pin 191 is inserted through the through hole 113 by, for example, a driving unit (not shown) having a motor embedded therein, and is protruded from the holding surface of the upper chuck 110 to press the center of the upper wafer W1.

The lower chuck 120 is divided into a plurality of (for example, two) regions 120a and 120b. These regions 120a and 120b are provided in this order from a center of the lower chuck 120 toward a periphery thereof. Further, in a plan view, the region 120a has a circular shape, whereas the region 120b has an annular shape.

Suction pipes 121a and 121b are provided independently in the regions 120a and 120b, respectively. Vacuum pumps 122a and 122b are respectively connected to the suction pipe 121a and 121b. The lower chuck 120 is capable of vacuum-attracting the lower wafer W2 in each of the regions 120a and 120b.

The lower chuck 120 is provided with a plurality of holding pins 125 configured to be movable up and down in the vertical direction. The lower wafer W2 is disposed on upper ends of these holding pins 125. Further, the lower wafer W2 may be vacuum-attracted to the upper ends of the holding pins 125.

The holding pins 125 are protruded from a holding surface of the lower chuck 120 when they are raised. In this state, the holding pins 125 receive the lower wafer W2 from the transfer device 61. Thereafter, the holding pins 125 are lowered to bring the lower wafer W2 into contact with the holding surface of the lower chuck 120. Then, the lower chuck 120 vacuum-attracts the lower wafer W2 horizontally in each of the regions 120a and 120b by the operation of the vacuum pumps 122a and 122b.

Now, with reference to FIG. 8 to FIG. 10C, details of the process S109 of FIG. 4 will be explained. First, the transfer device 61 carries the upper wafer W1 and the lower wafer W2 into the bonding apparatus 41 (process S111). In the process S111, the relative position of the upper chuck 110 and the lower chuck 120 is the substrate transfer position shown in FIG. 5 and FIG. 6.

Figure 7:
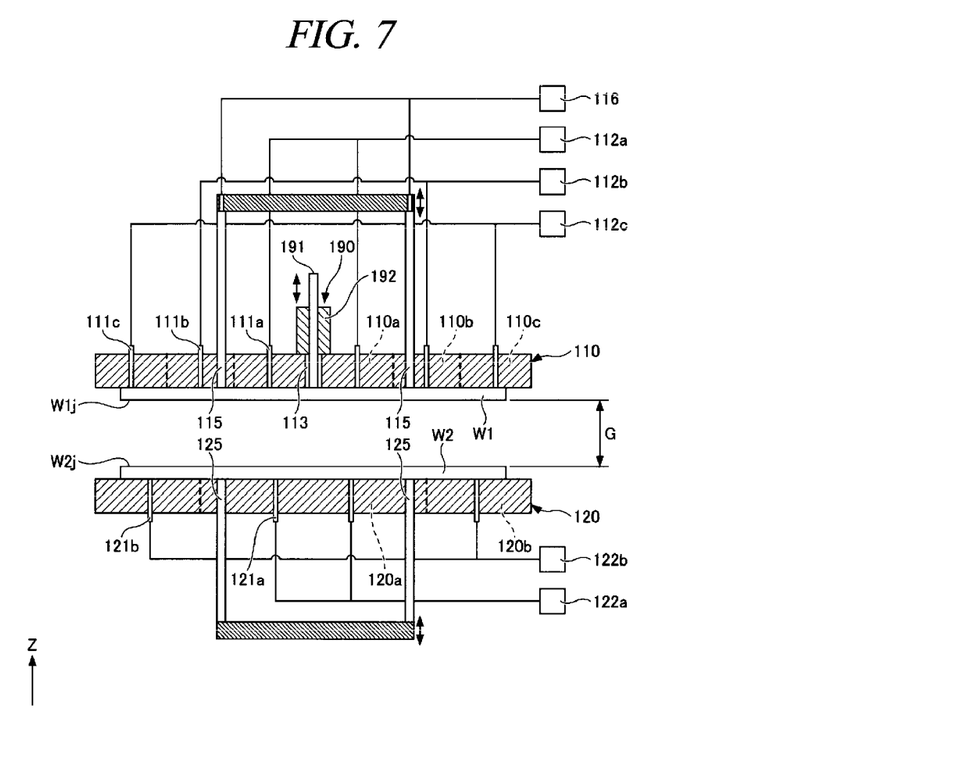
FIG. 7 is a cross sectional view illustrating an upper chuck and a lower chuck.
Figure 8:
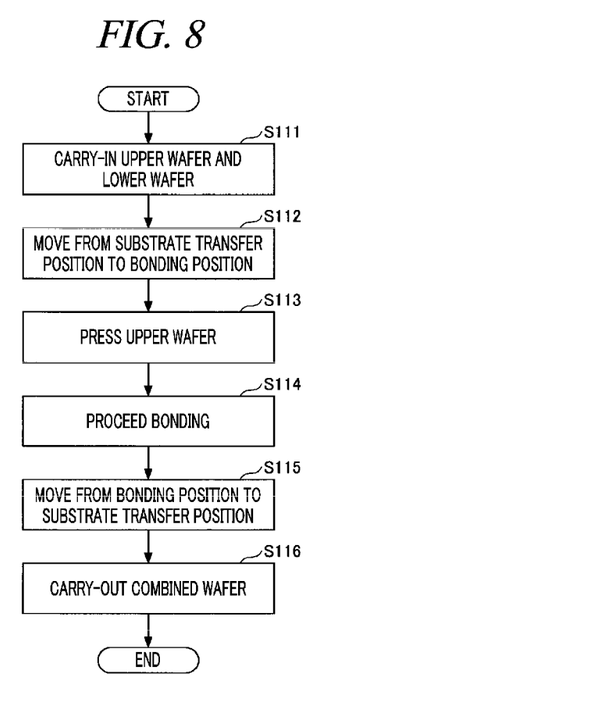
FIG. 8 is a flowchart illustrating details of a process S109 of FIG. 4.
Figure 9A:
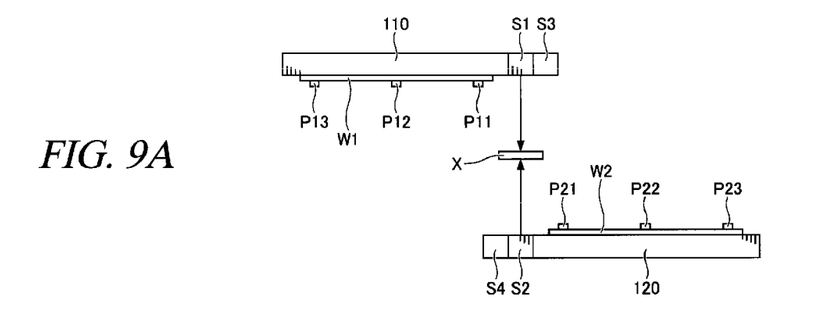
FIG. 9A is a side view illustrating an example of an operation in a process S112.
Figure 9B:
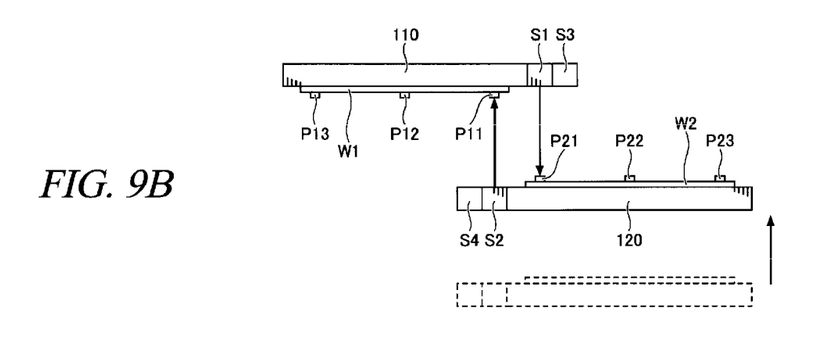
FIG. 9B is a side view illustrating an operation following the operation of FIG. 9A.
Figure 9C:
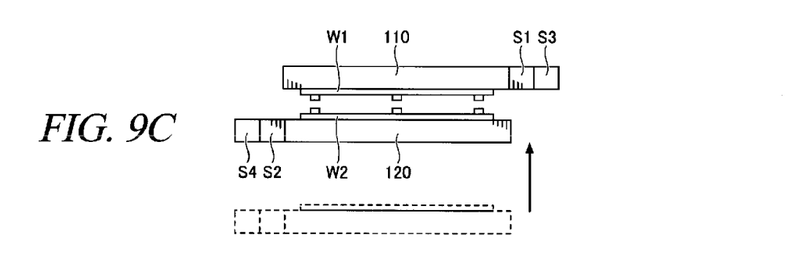
FIG. 9C is a side view illustrating an operation following the operation of FIG. 9B.

Next, the moving unit 130 moves the relative position of the upper chuck 110 and the lower chuck 120 from the substrate transfer position shown in FIG. 5 and FIG. 6 to the bonding position shown in FIG. 7 (process S112). In the process S112, the position alignment between the upper wafer W1 and the lower wafer W2 is carried out. As shown in FIG. 9A to FIG. 9C, a first camera S1 and a second camera S2 are used for the position alignment.

The first camera S1 is fixed to the upper chuck 110 and configured to image the lower wafer W2 held by the lower chuck 120. A plurality of reference points P21 to P23 are previously formed on the bonding surface W2j of the lower wafer W2. As the reference points P21 to P23, patterns such as electronic circuits may be used. The number of these reference points may be set as required.

Meanwhile, the second camera S2 is fixed to the lower chuck 120 and configured to image the upper wafer W1 held by the upper chuck 110. A plurality of reference points P11 to P13 are previously formed on the bonding surface W1j of the upper wafer W1. As the reference points P11 to P13, patterns such as electronic circuits may be used. The number of these reference points may be set as required.

First, as shown in FIG. 9A, the moving unit 130 adjusts the relative position of the first camera S1 and the second camera S2 in the horizontal direction. Specifically, the moving unit 130 moves the lower chuck 120 in the horizontal direction such that the second camera S2 is located substantially directly below the first camera S1. Then, the first camera S1 and the second camera S2 image a common target X, and the moving unit 130 finely adjusts the position of the second camera S2 in the horizontal direction such that the positions of the first camera S1 and the second camera S2 in the horizontal position are coincident. Through these operations, the position alignment between the first camera S1 and the second camera S2 is completed.

Thereafter, as illustrated in FIG. 9B, the moving unit 130 moves the lower chuck 120 vertically upwards, and, then, adjusts the positions of the upper chuck 110 and the lower chuck 120 in the horizontal direction. To elaborate, while the moving unit 130 is moving the lower chuck 120 in the horizontal direction, the first camera S1 images the reference points P21 to P23 of the lower wafer W2 sequentially, and the second camera S2 images the reference points P11 to P13 of the upper wafer W1 sequentially. FIG. 9B illustrates a state in which the first camera S1 images the reference point P21 of the lower wafer W2, and the second camera S2 images the reference point P11 of the upper wafer W1.

The first camera S1 and the second camera S2 transmit the obtained image data to the control device 90. The control device 90 controls the moving unit 130 based on the image data acquired by the first camera S1 and the image data acquired by the second camera S2, and adjusts the position of the lower chuck 120 in the horizontal direction such that the reference points P11 to P13 of the upper wafer W1 and the reference points P21 to P23 of the lower wafer W2 are coincident, when viewed from the vertical direction.

Next, as depicted in FIG. 9C, the moving unit 130 moves the lower chuck 120 vertically upwards. As a result, the distance G (see FIG. 7) between the bonding surface W2j of the lower wafer W2 and the bonding surface W1j of the upper wafer W1 becomes a predetermined distance ranging from, e.g., 80 µm to 200 µm. For the adjustment of the distance G, a first displacement meter S3 and a second displacement meter S4 are used.

Like the first camera S1, the first displacement meter S3 is fixed to the upper chuck 110 and configured to measure the thickness of the lower wafer W2 held by the lower chuck 120. The first displacement meter S3 radiates light to, for example, the lower wafer W2, receives reflection light reflected from the top surface and the bottom surface of the lower wafer W2, and measures the thickness of the lower wafer W2. For example, this thickness measurement is performed when the moving unit 130 moves the lower chuck 120 in the horizontal direction. A measurement method adopted by the first displacement meter S3 is, for example, a confocal method, a spectral interference method, a triangulation method, or the like. A light source of the first displacement meter S3 is an LED or a laser.

Meanwhile, the second displacement meter S4 is fixed to the lower chuck 120 like the second camera S2, and configured to measure the thickness of the upper wafer W1 held by the upper chuck 110. The second displacement meter S4 radiates light to, for example, the upper wafer W1, receives reflection light reflected from the top surface and the bottom surface of the upper wafer W1, and measures the thickness of the upper wafer W1. For example, this thickness measurement is performed when the moving unit 130 moves the lower chuck 120 in the horizontal direction. A measurement method adopted by the second displacement meter S4 is, for example, a confocal method, a spectral interference method, a triangulation method, or the like. A light source of the second displacement meter S4 is an LED or a laser.

The first displacement meter S3 and the second displacement meter S4 transmit the measured data to the control device 90. The control device 90 controls the moving unit 130 based on the data measured by the first displacement meter S3 and the data measured by the second displacement meter S4 to adjust the position of the lower chuck 120 in the vertical direction such that the distance G becomes a set value.

Figure 10A:
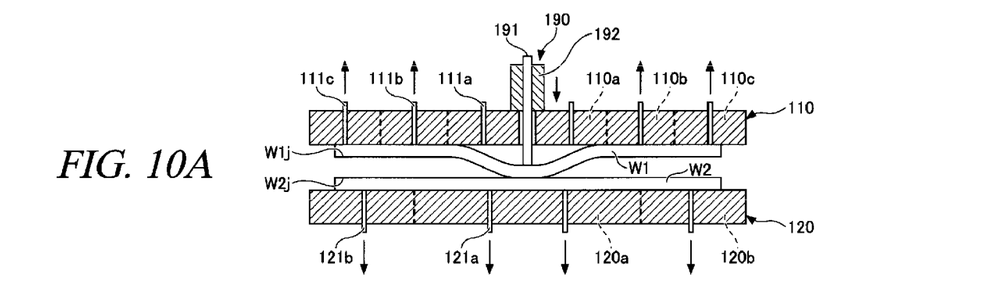
FIG. 10A is a cross sectional view illustrating an example of an operation in a process S113.

Subsequently, the operation of the vacuum pump 112a is stopped, and the vacuum attraction of the upper wafer W1 in the region 110a is released, as shown in FIG. 10A. Thereafter, the pressing pin 191 of the pressing unit 190 is lowered to press the center of the upper wafer W1, allowing the center of the upper wafer W1 to come into contact with the lower wafer W2 (process S113). As a result, the centers of the upper wafer W1 and the lower wafer W2 are bonded.

Since the bonding surface W1j of the upper wafer W1 and the bonding surface W2j of the lower wafer W2 are both modified, a Van der Waals force (an intermolecular force) is generated between the bonding surfaces W1j and W2j, so that the bonding surfaces W1j and W2j are first bonded to each other. In addition, since the bonding surface W1j of the upper wafer W1 and the bonding surface W2j of the lower wafer W2 are both hydrophilized, hydrophilic groups (for example, OH groups) are hydrogen-bonded, so that the bonding surface W1j and W2j are firmly bonded to each other.

Figure 10B:
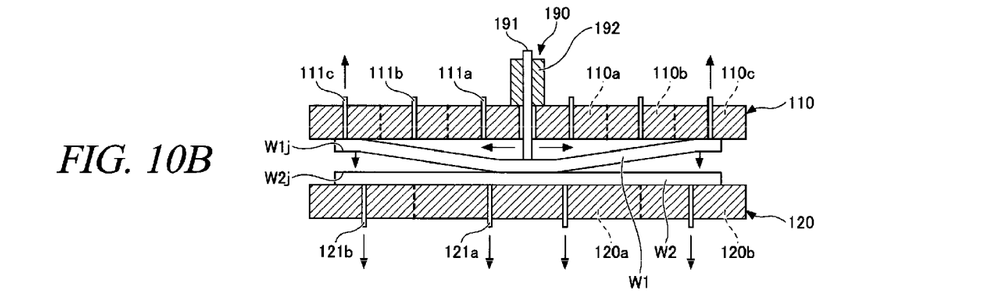
FIG. 10B is a cross sectional view illustrating an example of an operation in a process S114.
Figure 10C:
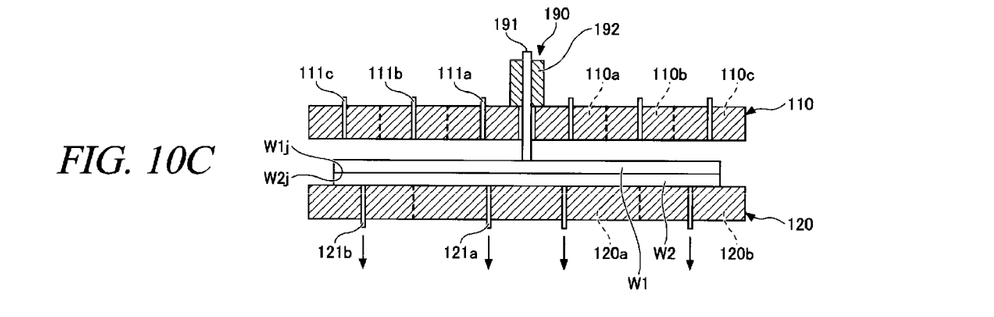
FIG. 10C is a cross sectional view illustrating an operation following the operation of FIG. 10B.

Next, the operation of the vacuum pump 112b is stopped, and the vacuum attraction of the upper wafer W1 in the region 110b is released, as shown in FIG. 10B. Then, the operation of the vacuum pump 112c is stopped, and the vacuum attraction of the upper wafer W1 in the region 110c is released, as shown in FIG. 10C.

In this way, the vacuum attraction of the upper wafer W1 is released step by step from the center toward the periphery of the upper wafer W1, and the upper wafer W1 drops stepwise onto the lower wafer W2 to come into contact with it. Then, the bonding of the upper wafer W1 and the lower wafer W2 proceeds sequentially from the center toward the periphery (process S114). As a result, the bonding surface W1j of the upper wafer W1 and the bonding surface W2j of the lower wafer W2 come into contact with each other entirely, so that the upper wafer W1 and the lower wafer W2 are bonded and the combined wafer T is obtained. Thereafter, the pressing pin 191 is raised to its original position.

Subsequently, the moving unit 130 moves the relative position of the upper chuck 110 and the lower chuck 120 from the bonding position shown in FIG. 7 to the substrate transfer position shown in FIG. 5 and FIG. 6 (process S115). For example, the moving unit 130 lowers the lower chuck 120 first to widen the distance between the lower chuck 120 and the upper chuck 110 in the vertical direction. Next, the moving unit 130 transversely moves the lower chuck 120 to shift the lower chuck 120 from the upper chuck 110 transversely.

Thereafter, the transfer device 61 carries out the combined wafer T from the bonding apparatus 41 (process S116). Specifically, the lower chuck 120 first releases the holding of the combined wafer T. Next, the plurality of holding pins 125 are raised to hand the combined wafer T over to the transfer device 61. Thereafter, the plurality of holding pins 125 are lowered to their original positions.

So far, the exemplary embodiments of the bonding apparatus and the bonding method according to the present disclosure have been described. However, the present disclosure is not limited to the above-described exemplary embodiments. Various changes, modifications, substitutions, additions, deletions and combinations may be made within the scope of the claims, which are all incorporated within a technical scope of the present disclosure.

According to the exemplary embodiment, it is possible to improve the accuracy of the position control over the second holder, thus enabling to improve the bonding accuracy between the substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A bonding apparatus configured to bond a first substrate and a second substrate, comprising:
 a first holder configured to attract and hold the first substrate;
 a second holder configured to attract and hold the second substrate;
 a first moving unit configured to move the second holder with respect to the first holder in a first horizontal direction;
 a first interferometer configured to measure, by radiating light to the second holder or a first object which is moved along with the second holder in the first horizontal direction, a distance from the first interferometer to the second holder or the first object in the first horizontal direction;
 a housing accommodating therein the first holder, the second holder, the first moving unit, and the first interferometer;
 a gas supply provided at a lateral side of the housing, and configured to supply a gas into the housing; and
 an airflow control cover provided within the housing, and configured to redirect a part of a flow of the gas supplied from the gas supply toward a first path of the light radiated from the first interferometer.

2. The bonding apparatus of claim 1,
 wherein the airflow control cover redirects the part of the flow of the gas toward the first path from obliquely above the first path.

3. The bonding apparatus of claim 2,
 wherein the airflow control cover comprises an inclined plate inclined downwards toward a direction in which the gas from the gas supply is discharged.

4. The bonding apparatus of claim 1, further comprising:
 a support frame provided within the housing and configured to support the first holder, the second holder, the first moving unit, the first interferometer, and the airflow control cover,
 wherein the airflow control cover redirects the part of the flow of the gas toward the first path from above the support frame.

5. The bonding apparatus of claim 4,
 wherein the support frame comprises a placing table, multiple supporting columns uprightly standing on a top surface of the placing table, and an upper frame horizontally disposed on upper ends of the multiple supporting columns,
 the airflow control cover comprises an inclined plate inclined downwards toward a direction in which the gas from the gas supply is discharged, and
 the upper frame is provided with an opening through which the inclined plate passes.

6. The bonding apparatus of claim 5,
 wherein the upper frame holds the first holder from above, the first holder holds the first substrate from above, and the second holder holds the second substrate from below, and
 a lower end of the inclined plate is disposed above a bottom surface of the first holder, the bottom surface attracting and holding the first substrate.

7. The bonding apparatus of claim 5,
 wherein a size of the airflow control cover in the first horizontal direction is smaller than a size of the upper frame in the first horizontal direction.

8. The bonding apparatus of claim 1,
 wherein the gas supply discharges the gas into the housing in a second horizontal direction orthogonal to the first horizontal direction, and
 the first path is orthogonal to a direction in which the gas from the gas supply is discharged.

9. The bonding apparatus of claim 1,
 wherein the first interferometer is a laser interferometer.

10. The bonding apparatus of claim 1, further comprising:
 a second moving unit provided within the housing, and configured to move the second holder with respect to the first holder in a second horizontal direction orthogonal to the first horizontal direction; and
 a second interferometer provided within the housing, and configured to measure, by radiating light to the second holder or a second object which is moved along with the second holder in the second horizontal direction, a distance from the second interferometer to the second holder or the second object in the second horizontal direction.

11. The bonding apparatus of claim 10,
 wherein the airflow control cover overlaps with a second path of the light radiated from the second interferometer, when viewed from above.

12. A bonding method of bonding a first substrate and a second substrate, comprising:
 attracting and holding the first substrate with a first holder;
 attracting and holding the second substrate with a second holder;
 moving the second holder by using a first moving unit configured to move the second holder with respect to the first holder in a first horizontal direction;
 measuring, by radiating light from a first interferometer to the second holder or a first object which is moved along with the second holder in the first horizontal direction, a distance from the first interferometer to the second holder or the first object in the first horizontal direction;
 supplying a gas into a housing from a gas supply provided at a lateral side of the housing accommodating therein the first holder, the second holder, the first moving unit, and the first interferometer; and
 redirecting a part of a flow of the gas supplied from the gas supply toward a first path of the light radiated from the first interferometer, by using an airflow control cover provided within the housing.

* * * * *